(12) United States Patent
Kirscht

(10) Patent No.: US 7,290,185 B2
(45) Date of Patent: Oct. 30, 2007

(54) METHODS AND APPARATUS FOR REDUCING MEMORY ERRORS

(75) Inventor: Joseph A. Kirscht, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 11/116,625

(22) Filed: Apr. 28, 2005

(65) Prior Publication Data

US 2006/0248411 A1 Nov. 2, 2006

(51) Int. Cl.
*G06F 11/00* (2006.01)
(52) U.S. Cl. ........................ 714/704; 714/718
(58) Field of Classification Search ............. 714/4, 714/704, 718; 711/171; 365/185.09, 185.11
See application file for complete search history.

(56) References Cited

U.S. PATENT DOCUMENTS

| | | | | |
|---|---|---|---|---|
| 5,519,830 A | * | 5/1996 | Opoczynski | 714/4 |
| 6,141,737 A | * | 10/2000 | Krantz et al. | 711/171 |
| 7,173,852 B2 | * | 2/2007 | Gorobets et al. | 365/185.09 |
| 7,224,607 B2 | * | 5/2007 | Gonzalez et al. | 365/185.11 |

* cited by examiner

*Primary Examiner*—David Ton
(74) *Attorney, Agent, or Firm*—Dugan & Dugan

(57) ABSTRACT

In a first aspect, a first method is provided for reducing memory errors. The first method includes the steps of (1) detecting at least one error in data output from a first physical memory unit (PMU) of a memory; (2) detecting at least one error in data output from a second PMU of the memory; and (3) setting a bit indicating respective data output from a plurality of PMUs includes errors. Numerous other aspects are provided.

20 Claims, 3 Drawing Sheets

METHODS AND APPARATUS FOR REDUCING MEMORY ERRORS

FIELD OF THE INVENTION

The present invention relates generally to computer systems, and more particularly to methods and apparatus for reducing memory errors within such systems.

BACKGROUND

Existing methods and apparatus of checking memory for errors may include employing a memory controller to periodically access a memory to gather statistics regarding physical memory units (PMUs), such as DRAMs or similar memory units, from which data may be output during memory accesses. If errors output from a single PMU exceed a predetermined threshold (e.g., a count), the controller may activate an interrupt so that evasive and/or corrective action may be taken. The action may prevent the errors output from the PMU from creating an uncorrectable error that may require a halt of the computer system including the memory.

Errors in data output from two or more PMUs also may be problematic even though no single PMU has an error level that exceeds its predetermined error threshold. Accordingly, methods and apparatus for checking memory for errors in such circumstances are desirable.

SUMMARY OF THE INVENTION

In a first aspect of the invention, a first method is provided for reducing memory errors. The first method includes the steps of (1) detecting at least one error in data output from a first physical memory unit (PMU) of a memory; (2) detecting at least one error in data output from a second PMU of the memory; and (3) setting a bit indicating respective data output from a plurality of PMUs includes errors.

In a second aspect of the invention, a first apparatus is provided for reducing memory errors. The first apparatus includes (1) a memory including a plurality of physical memory units (PMUs); and (2) logic, coupled to the memory. The logic is adapted to (a) detect at least one error in data output from a first PMU of the memory; (b) detect at least one error in data output from a second PMU of the memory; and (c) set a bit indicating respective data output from a plurality of the PMUs includes errors.

In a third aspect of the invention, a first system is provided for reducing memory errors. The first system includes (1) a memory including a plurality of physical memory units (PMUs); (2) logic coupled to the memory; and (3) a processor coupled to the memory and logic and adapted to access the memory. The logic is adapted to (a) detect at least one error in data output from a first PMU of the memory; (b) detect at least one error in data output from a second PMU of the memory; and (c) set a bit indicating respective data output from a plurality of the PMUs includes errors. Numerous other aspects are provided in accordance with these and other aspects of the invention.

Other features and aspects of the present invention will become more fully apparent from the following detailed description, the appended claims and the accompanying drawings.

DETAILED DESCRIPTION

Figure 1:
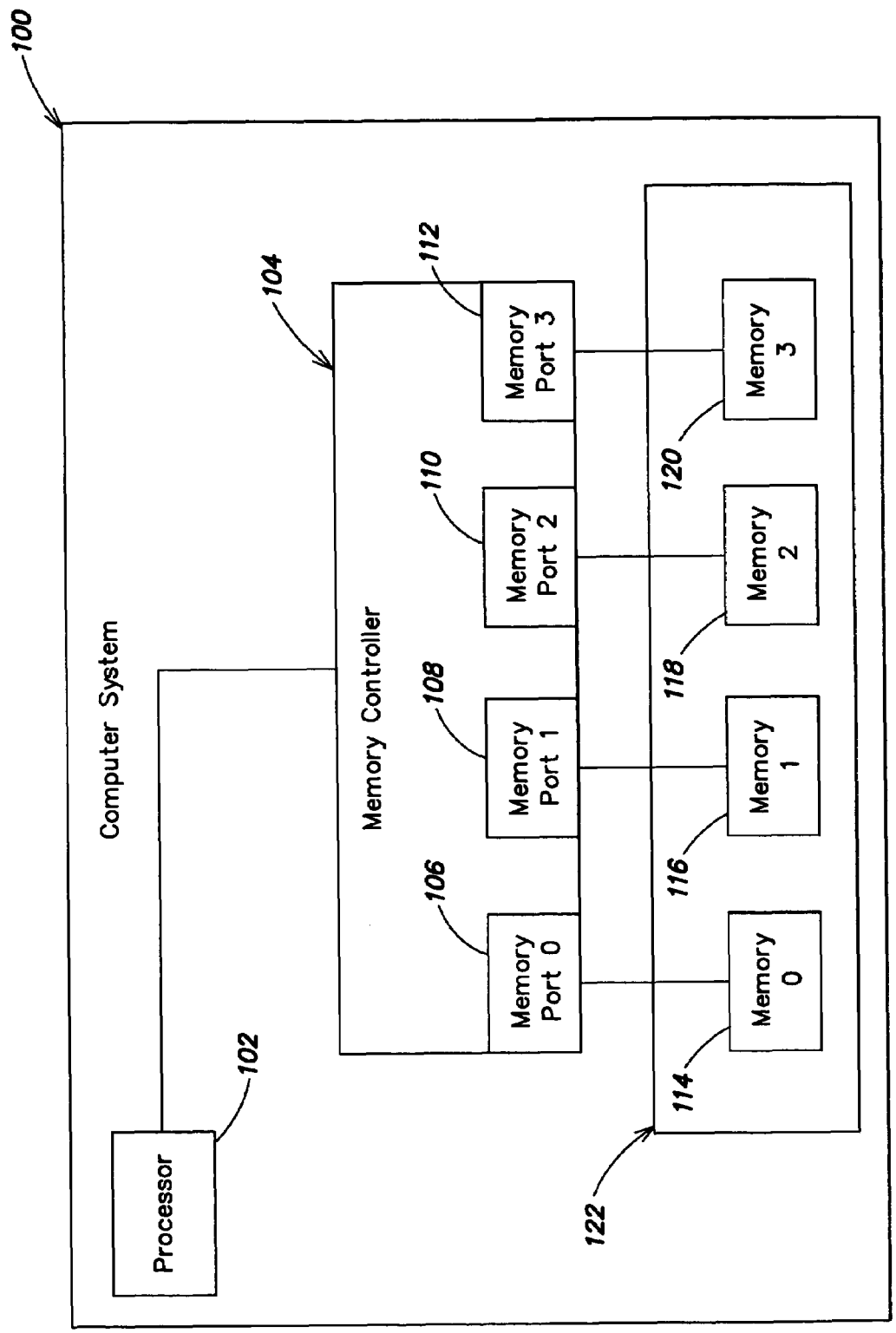
FIG. 1 is a block diagram of a system including apparatus for reducing memory errors in accordance with embodiment of the present invention.

The present invention provides methods and apparatus adapted to detect and optionally repair memory access errors that in prior art systems may normally not be addressed because the frequency of such errors may fall below a practicable threshold in individual memory units. Such errors may result from rays or particles impacting the memory, memory hardware failure, other memory hardware problems and/or environmental factors, etc. The memory accesses may be performed (e.g., by a controller such as a scrub controller) as part of a normal processing operation. According to the present invention, if respective data output from two distinct physical memory units (PMUs), such as a DRAM or similar memory unit, includes errors during the memory accesses, an error condition may be identified. Additionally, the present methods and apparatus may take an "evasive" and/or corrective action, such as using a spare or redundant PMU in place of a failing PMU in order to prevent such errors from combining to form an uncorrectable error in a subsequent memory access.

Typically, an output of one or more DIMMs may form a memory cacheline. Each such DIMM may include a plurality of PMUs. Data (e.g., bits) output from each PMU may be included in a respective packet that forms a symbol. In other words, a different symbol may correspond to each PMU.

Existing methods and apparatus of checking memory for errors may include employing a memory controller to periodically access a memory to gather statistics regarding all such symbols. If errors associated with a single symbol meet or exceed a predetermined threshold (e.g., a count), the controller may activate an interrupt so that evasive and/or corrective action may be taken. The action may prevent the single symbol error that exceeds the predetermined threshold from aligning with another error and creating an uncorrectable error, which may require a halt of the computer system including such memory. Therefore, the existing methods may trigger corrective action for a single symbol error only if the error exceeds a predetermined threshold. The predetermined threshold may be set to a value large enough to avoid triggering evasive action for errors that may not be considered severe (e.g., errors from rays or particles hitting the system, etc.)

However, multiple single symbol errors (e.g., errors in data output from different PMUs), none of which individually exceed a predetermined threshold, may in combination be problematic. For example, two different single symbol errors, each of which do not exceed the threshold, may appear in a single cacheline (e.g., align) during a memory access to form an uncorrectable error.

The present invention provides methods and apparatus for triggering evasive action upon detection of such multiple single symbol errors. As the memory controller accesses the memory, errors on each single symbol are detected and logged. As subsequent errors on a previously-encountered and logged single symbol are encountered, a count included in the log may be incremented. In this manner, single symbol errors occurring on a plurality of symbols may be logged during memory accesses. Further, such occurrence(s) may be flagged. A reset of error statistics when the controller reaches the end of the memory during a series of accesses is suppressed. In this manner, error logic may be employed to determine the symbol for which the most errors are logged (e.g., the symbol with the highest logged count). Additionally, even though the number of errors for the symbol may not exceed the predetermined threshold, the error logic may take action to correct such errors and/or evade similar errors in the future. Therefore, errors on such a single symbol may not align with another single symbol error to form an uncorrectable error during a subsequent memory access. Consequently, the present methods and apparatus may improve memory performance by reducing errors encountered during memory access.

FIG. 1 is a block diagram of a system including an apparatus for reducing memory errors in accordance with an embodiment of the present invention. With reference to FIG. 1, the system 100 may be a computer or the like. The system 100 may include one or more processors 102 (only one shown) coupled to the apparatus 104 for reducing memory errors. The apparatus 104 for reducing memory errors may be a memory controller. Alternatively, one or more portions of the apparatus 104 for reducing memory errors may be included in and/or coupled to the memory controller. The apparatus 104 for reducing memory errors may be adapted to receive requests to access memory from the processor 102, and access memory in response to such requests.

The apparatus 104 for reducing memory errors may include one or more ports 106-112 for coupling to respective memories 114-120. Such memories 114-120 may form a local memory 122. For example, the apparatus 104 for reducing memory errors may include four ports 106-112, each of which may be coupled to a respective first through fourth memories 114-120. However, the apparatus 104 may include a larger or smaller number of ports 106-112 and/or the system 100 may include a larger or smaller number of memories 114-120. Additional details of the apparatus 104 for reducing memory errors and a memory 114-120 coupled thereto are described below with reference to FIG. 2.

Figure 2:
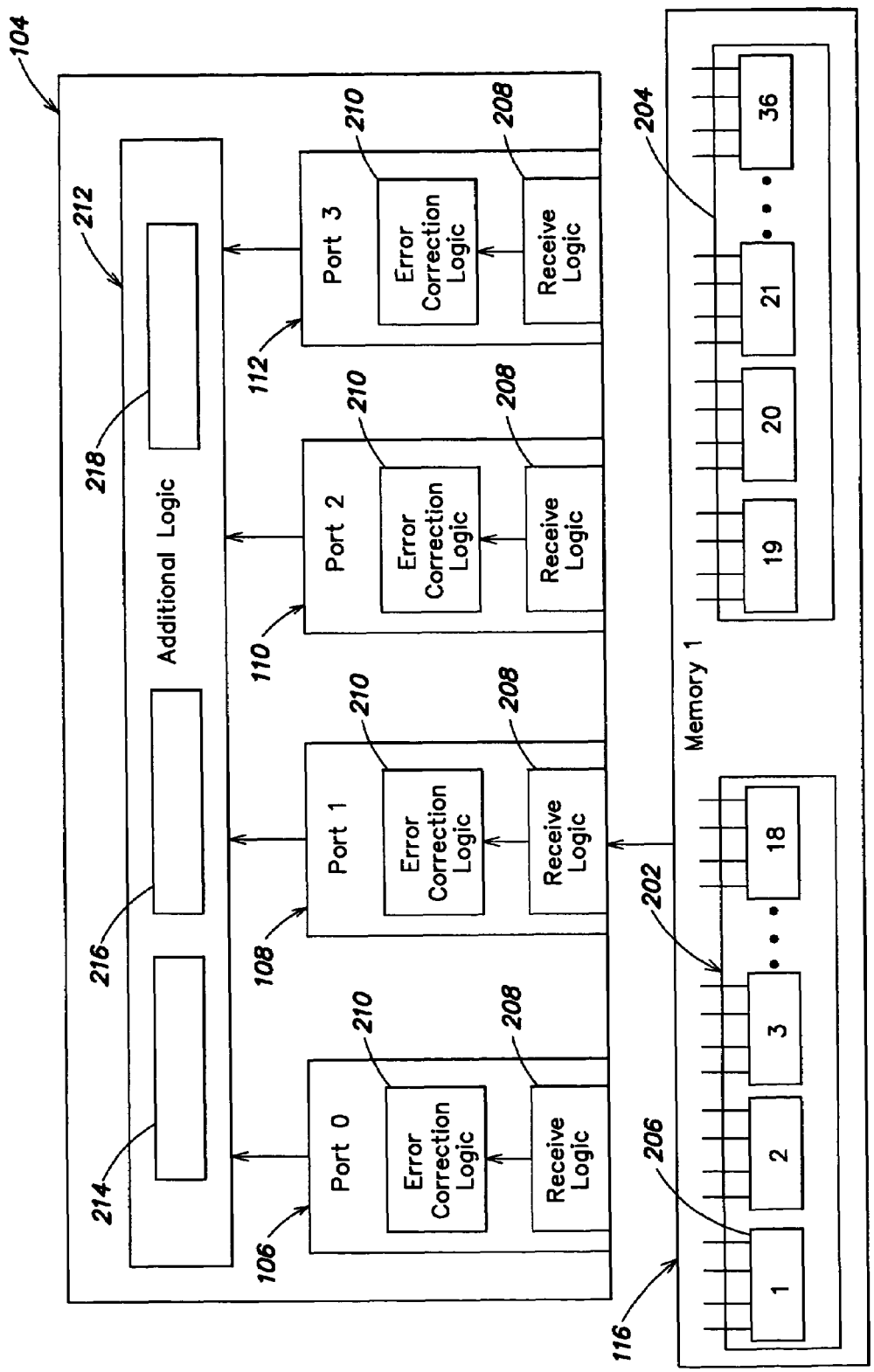
FIG. 2 is a detailed block diagram of the apparatus for reducing memory errors in accordance with an embodiment of the present invention.

FIG. 2 is a detailed block diagram of the apparatus 104 for reducing memory errors in accordance with an embodiment of the present invention. With reference to FIG. 2, a memory port 108 of the apparatus 104 for reducing memory errors may be coupled to a memory 116. Although only memory port 108 is shown coupled to memory 116, remaining memory ports 106, 110, 112 may be coupled to respective memories 114, 118, 120 (not shown in FIG. 2) in a similar manner. The memory 114-120 may include a plurality of Dual Inline Memory Modules (DIMMs) 202-204. One or more of such DIMMs may form a memory rank (or extent). For example, a memory 114-120 may include two DIMMS 202-204 that form a memory rank (although a larger or smaller number of DIMMs may be employed). Each DIMM 202-204 may include a plurality of physical memory units (PMUs) such as DRAMs 206 or similar units of memory. For example, a DIMM 202-204 may include eighteen PMUs 206 (although a larger or smaller number of PMUs 206 may be employed). Each PMU 206 may be adapted to store and output one or more bits. For example, each PMU 206 may be adapted to output four bits of data. Such data output from a PMU 206 may serve as a symbol associated with the PMU 206. Therefore, because the memory 114-120 may include two DIMMs 202, 204, each of which may include eighteen PMUs 206, the memory 114-120 may output thirty-six symbols (e.g., 2 DIMMs×18 PMUs=36 symbols). In some embodiments, thirty-two PMUs 206 may store bits of data, and four PMUs 206 may store error-correction code (ECC) check bits adapted to indicate errors in the data bits. Therefore, in such embodiments, during a transfer (e.g., each burst of the transfer) from the memory 114-120, thirty-two PMUs 206 may output bits of data, and four PMUs 206 may output error-correction code (ECC) check bits. However, PMUs 206 in the memory 114-120 may be employed to store and/or output data in a different manner. For example, a larger or smaller number of PMUs 206 may be employed to store the bits of data and/or a larger or smaller number of PMUs 206 may be employed to store the ECC check bits.

Each memory port 106-112 may include receive logic 208 adapted to receive data from a corresponding memory 114-120. Further, each memory port 106-112 may include error correction logic 210 adapted to receive data from a corresponding memory 106-112, determine whether the data from any particular PMUs 206 (e.g., symbols) includes errors. More specifically, the error correction logic 210 may be adapted to identify a symbol which includes the error. Additionally, the error correction logic 210 may be adapted to correct the error, and output the corrected data.

Further, the apparatus 104 for reducing memory errors may include and/or be coupled to additional logic 212 adapted to track errors in data output from respective PMUs 206 (e.g., symbol errors), raise an interrupt indicating data output from a first PMU (e.g., a first symbol) included errors during a first memory access and data output from a second PMU (e.g., a second symbol) included errors during a second memory access. Further, the additional logic 212 may be adapted to perform an evasive action based on the tracked errors. The evasive action may reduce and/or eliminate the chance of errors in the first and second symbols from occurring in the same memory access, which may result in an uncorrectable memory error that may require a halt of the system 100. For example, the additional logic 212 may include error statistics logic 214 adapted to track errors in data output from the memory 114-120 (e.g., PMUs 206 of the memory 114-120) as described above. Additionally, the additional logic 212 may include reliability-availability-serviceability (RAS) logic 216 adapted to raise an interrupt as described above. Further, the additional logic 212 may include system management interface (SMI) logic 218 adapted to perform the evasive action as described above. Although the error statistics logic 214, RAS logic 216 and the SMI 218 perform the functions of the additional logic 212, the additional logic 212 may include a larger or smaller amount of logic to perform such functions.

Details of the operation of the system 100 including an apparatus 104 for reducing memory errors is now described with reference to FIGS. 1 and 2 and with reference to FIG. 3 which illustrates a method for reducing memory errors in accordance with an embodiment of the present invention. To reduce memory errors, the system 100 may operate in a plurality of modes. For example, the system 100 may operate in a first mode, a 16-byte mode, in which data may be output and operated on by the error correction logic 210 sixteen bytes at a time. Alternatively, the system 100 may operate in a second mode, a 32-byte mode, in which data may be output from memory 114-120 as two 16-byte transfers. Such transfers are merged, and the merged data (e.g., thirty-two bytes of data) may be operated on by the error correction logic 210. Although two modes of operation are described, the system 100 may operate in a larger or smaller number of modes.

16-Byte Mode

Figure 3:
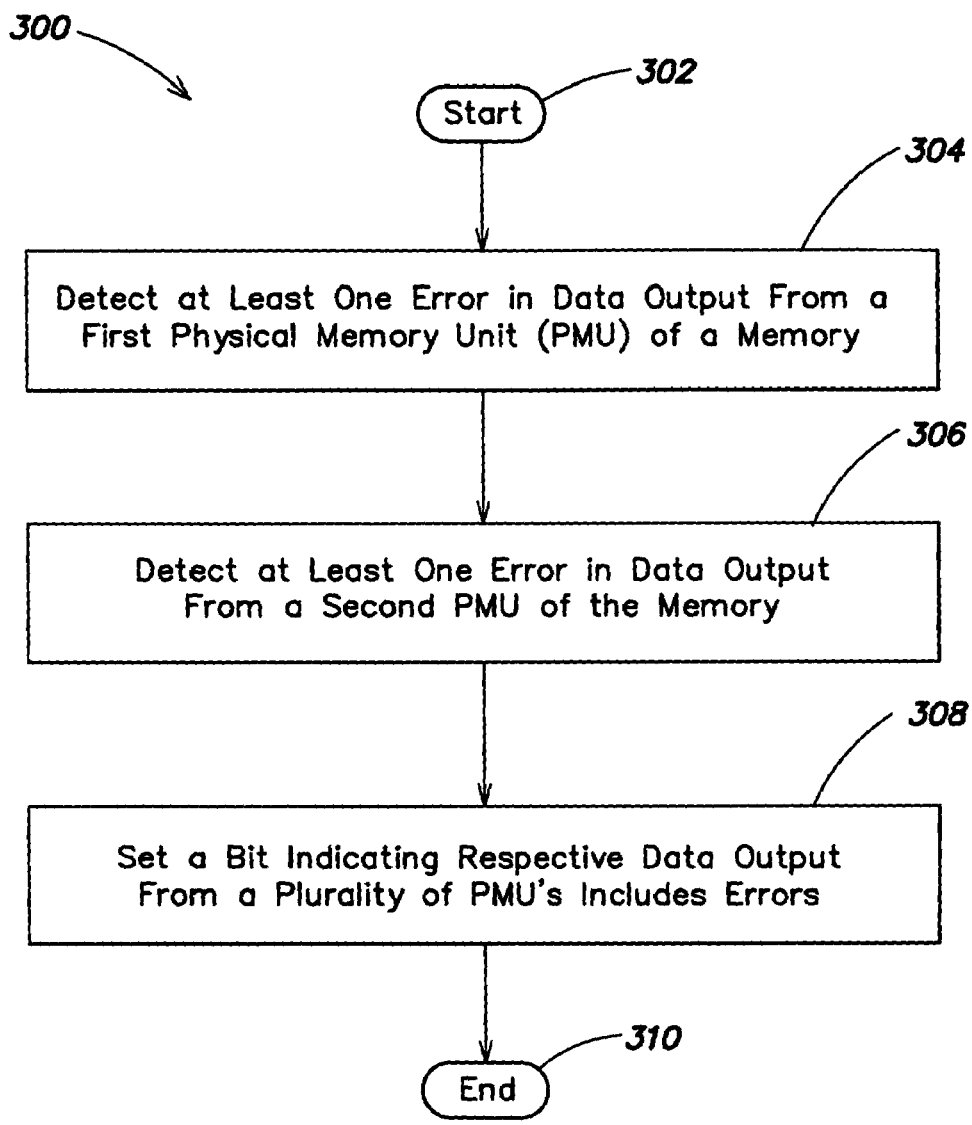
FIG. 3 illustrates a method for reducing memory errors in accordance with an embodiment of the present invention.

With reference to FIG. 3, in step 302, the method 300 begins. In step 304, at least one error may be detected in data output from a first physical memory unit (PMU) of a memory. During operation, the system 100 may access memory 114-120. For example, the system 100 may be adapted to periodically access memory 114-120 during operation to check the memory 114-120 for errors. More specifically, the system may periodically access memory locations (e.g., every memory location) included in a memory rank of the memory 114-120. A memory rank may include a plurality of PMUs 206 in one or more DIMMs 202-204 of the memory 114-120. For example, during operation, the system 100 may systematically access a plurality of cachelines (e.g., every cacheline) included in the memory rank of the memory 114-120. To form a single cacheline, data may be output from each of a plurality of PMUs 206 in each of one or more bursts. Each burst may include 144 bits, 128 bits (e.g., sixteen bytes) of which are data and sixteen bits of which are error correction code (ECC) check bits. More specifically, each burst may include thirty-two symbols of data and four symbols of ECC check bits. A cacheline may include sixty-four bytes of data, and therefore, the memory 114-120 may output four bursts of data to form a single cacheline. However, a cacheline of a larger or smaller size may be employed.

While systematically accessing the plurality of cachelines included in the memory rank of the memory 114-120, receive logic 208 included in the memory port 106-112 to which the memory 114-120 is coupled may receive the first burst of data and provide such data to error correction logic 210 coupled thereto. Based on the ECC bits included in the burst, the error correction logic 210 may detect an error in the cacheline output from the memory 114-120. More specifically, the error correction logic 210 may detect a symbol in the burst which includes an error, and therefore, may identify the PMU 206 from which the erroneous data is output. In a similar manner, the receive logic 208 may provide remaining bursts of the cacheline to the error correction logic 210, and the error correction logic 210 may detect errors in such bursts of the cacheline.

If the error correction logic 210 detects an error in data output from a single PMU 206 while accessing the cacheline, the error correction logic 210 may correct such error in the data. Further, the error statistics logic 214 may log the error in data output from the PMU 206 (e.g., an error on the symbol corresponding to the PMU 206). The error statistics logic 214 may include a counter (not shown) corresponding to each PMU 206 from which data may be output, and therefore, corresponding to each symbol. Each counter may be adapted to count the number of errors in data output from a corresponding PMU 206 as the system periodically accesses memory locations in a memory rank included in the memory 114-120.

Therefore, as an error is detected on data output from a first PMU 206 such as PMU 1 (e.g., on a first symbol), the error statistics logic 214 may compare the first symbol with any previously-logged symbols to determine whether the first symbol has been logged. If so, the error statistics logic 214 may determine whether a count stored in a counter corresponding to the first symbol matches a predetermined threshold of errors. If not, the error statistics logic may increment the count stored in the counter. However, if the count stored in the counter corresponding to the first symbol matches the predetermined threshold, an interrupt may be raised such that the system may take an evasive action adapted to prevent such error from becoming an uncorrectable error. Alternatively, if the error statistics logic 214 determines the first symbol has not been logged previously, the error statistics logic 214 may log the first symbol and increment a count stored in the counter corresponding to the first symbol.

Remaining cachelines included in the memory rank of the memory 114-120 may be accessed in a similar manner. Further, any errors in such cachelines may be detected, corrected and/or logged in a similar manner. For example, in step 306, at least one error may be detected in data output from a second PMU 206 (e.g., PMU 20) of the memory 114-120. More specifically, while accessing a remaining cacheline, data output from a second PMU 206 to form the cacheline (e.g., a second symbol) may include an error. The error correction logic 210 may correct such error. Further, error statistics logic 214 may compare the second symbol with previously-logged symbols (e.g., the first symbol) to determine whether the second symbol has been logged. Assuming the second symbol has not been logged previously, the error statistics logic 214 may log the symbol and increment a count stored in the counter corresponding to the second symbol. However, if the second symbol has been previously logged, the error statistics logic 214 may increment the count stored in the counter corresponding to the second symbol.

Thereafter, the system 100 may continue to access remaining cachelines included in the memory rank of the memory 114-120, detecting errors in data output from the memory 114-120 and logging such detected errors until the end of the memory rank of the memory 114-120 is reached.

In step 308, a bit may be set indicating respective data output from a plurality of PMUs 206 includes errors. More specifically, the RAS logic 216 coupled-to the error statistics logic 214 may be adapted to determine whether data output from a plurality of PMUs 206 (e.g., PMU 1 and PMU 20) includes errors. For example, the RAS logic 216 may access the error statistics logic 214, and determine whether two symbols (e.g., a first symbol corresponding to PMU 1 and a second symbol corresponding to PMU 20) have been logged, which may indicate that at least one error occurred in data output from the first symbol while accessing a first cacheline and at least one error occurred in data output from the second symbol while accessing a second cacheline as the system 100 systematically accessed a plurality of cachelines (e.g., every cacheline) included in the memory rank of the memory 114-120. The system 100 may determine the individual frequency of the first and second errors during the systematic accesses has not exceeded the predetermined threshold. Therefore, the first and/or second errors may be infrequent. Notwithstanding, if two symbols have been logged, the RAS logic 216 may set a bit indicating (e.g., flagging) such occurrence. Consequently, the system 100 may choose to deallocate a PMU associated with the first and/or second symbol (e.g., PMU 1 and/or PMU 20) for subsequent memory accesses. In contrast to conventional systems, in some embodiments of the present invention, data stored in the error statistics logic 214 may not be reset after the bit indicating errors in two symbols have been logged is set.

Thereafter, step 310 may be performed. In step 310, the method 300 ends.

Through use of the present methods in a first mode, the system 100 may detect at least one error in data output from a first PMU 206 (e.g., a first symbol) while accessing a first cacheline and at least one error in data output from a second PMU 206 (e.g., a second symbol) while accessing a second cacheline as the system 100 accesses a plurality of cachelines (e.g., every cacheline) included in the memory rank of the memory 114-120. Although a frequency of the first symbol error or second symbol error does not exceed a predetermined threshold, the system 100 may flag such occurrence. In this manner, the system may prevent respective errors in data output from one or more of such PMUs 206 from causing an uncorrectable error, which may require a system halt, from forming.

32-Byte Mode

In a similar manner to the 16-byte Mode, the method 300 may be employed while the system 100 operates in a different mode, such as a 32-byte Mode. While operating in the 32-byte Mode, to form a single cacheline, data may be output from each of the PMUs 206 in a plurality of bursts. In contrast to the 16-byte Mode, each burst may include 144 bits, 128 of which are data and some (e.g., twelve) of which are error correction code (ECC) check bits. More specifically, each burst may include thirty-two symbols of data and three symbols of ECC check bits. Each burst may also include a spare or redundant symbol. Similar to the 16-byte Mode, in the 32-byte Mode, a cacheline may include sixty-four bytes of data, and therefore, the memory 114-120 may output four bursts of data to form a single cacheline. While systematically accessing the plurality of cachelines included in the memory rank of the memory 114-120 in 32-byte Mode, the receive logic 208 included in the memory port to which the memory 114-120 is coupled may receive the first burst of data and provide such data to error correction logic 210 coupled thereto. Subsequently, the receive logic 208 may receive a second burst of data and provide such data to error correction logic 210. In contrast to the 16-byte Mode, in the 32-byte Mode, the error correction logic 210 may merge a plurality of bursts (e.g., the first and second bursts) and operate on such bursts together. For example, based on the ECC bits included in the first and second bursts, the error correction logic 210 may detect an error in the cacheline output from the memory 114-120. More specifically, the error correction logic 210 may detect a symbol in the first or second burst which includes an error, and thereby, may identify the PMU 206 from which the erroneous data is output. In a similar manner, the receive logic 208 may provide remaining bursts (e.g., the third and fourth bursts) of the cacheline to the error correction logic 210, and the error correction logic 210 may merge a plurality of such bursts and detect errors in such merged bursts of the cacheline.

In the 16-byte Mode, when a bit is set indicating two symbols have been logged during the systematic memory accesses, the system 100 may not employ a PMU 206 associated with the first and/or second symbol for subsequent memory accesses. In contrast, while operating in the 32-byte Mode, when the RAS logic 216 sets a bit indicating two symbols have been logged, the system 100 may employ an evasive and/or corrective action. More specifically, the bit set by the RAS logic 216 may serve to raise an interrupt (e.g., a recoverable error attention). The interrupt may trigger the SMI 218 to perform an evasive and/or corrective action. In the 32-byte Mode, statistics stored by the error statistics logic 214 may not be reset after the bit indicating two symbols have been logged is set. Therefore, once such bit triggers the SMI logic 218 to perform an evasive and/or corrective action, the SMI logic 218 may determine the frequency of errors on data output from the first PMU 206 (e.g., first symbol) and data output from the second PMU 206 (e.g., second symbol). The SMI logic 218 may access (e.g., read) the respective counts stored in the counters corresponding to the first and second symbols. The SMI Logic 218 may compare a plurality of counts (e.g., counts corresponding to the first and second symbols) and select the largest count, thereby selecting the symbol (and PMU 206) corresponding to the largest count.

Based on the largest count, the SMI logic 218 may perform an evasive action and/or corrective action. Such action may reduce and/or eliminate the chance of an uncorrectable error forming during a subsequent memory access. More specifically, the action may reduce and/or eliminate the chance of errors in data output from a first PMU 206 and errors in data output from a second PMU 206 from occurring during a single memory access (e.g., while accessing a single cacheline). The action may be a redundant bit steer or similar action such as a redundant symbol steer. To perform a redundant bit or symbol steer, the SMI logic 218 may read data output from a PMU 206 (e.g., symbol) corresponding to the largest count (e.g., the selected PMU 206 and/or symbol) and provide such data to the error correction logic 210. The error correction logic 210 may correct errors in data output from the selected PMU 206 (e.g., first or second PMU) and output the corrected data. The apparatus 104 for reducing memory errors may store the corrected data in the spare or redundant PMU 206 (e.g., a third PMU such as PMU 36). Further, the apparatus 104 may direct all subsequent accesses to the selected PMU 206 (e.g., first or second PMU) to the spare PMU 206 (e.g., third PMU). For example, the apparatus 104 may direct a request to perform a read operation on the selected PMU 206 to the spare PMU 206. Similarly, the apparatus 104 may direct a request to perform a write operation on the selected PMU 206 to the spare PMU 206. In this manner, the evasive and/or corrective action may prevent an error in data output from the selected PMU 206 from combining with an error in data output from another PMU 206 while accessing a single cacheline (e.g., while systematically accessing a plurality of cachelines included in the memory rank of the memory 114-120).

Through use of the present methods in a second mode, the system 100 may detect at least one error in data output from a first PMU 206 (e.g., a first symbol) while accessing a first cacheline and at least one error in data output from a second PMU 206 (e.g., a second symbol) while accessing a second cacheline as the system 100 accesses a plurality of cachelines (e.g., every cacheline) included in the memory rank of the memory 114-120. Although a frequency of the first or second error does not exceed a predetermined threshold, the system 100 may flag such occurrence. Further, the system 100 may perform an evasive and/or corrective action, such as a redundant bit or symbol steer, to reduce and/or eliminate the chance that an error in data output from the first or second PMU 206 will combine with an error in data output from another PMU 206 during a subsequent memory access. In this manner, the system 100 may prevent errors in data output from multiple PMUs 206 from causing an uncorrectable error, which may require a system halt, from forming.

The foregoing description discloses only exemplary embodiments of the invention. Modifications of the above disclosed apparatus and methods which fall within the scope of the invention will be readily apparent to those of ordinary skill in the art. For instance, although the error statistics logic 214, RAS logic 216, SMI logic 218, and respective functionality thereof are described above, in some embodiments, two or more of such logic 214-218 and respective functionality thereof, may be integrated. Further, although the apparatus 104 for reducing memory errors includes the additional logic 212, in some embodiments, one or more components of the additional logic 212 may be external to the apparatus 104. For example, the. SMI logic 218 may be external to the apparatus 104 for reducing memory errors. Further, although the evasive and/or corrective action described above is performed on single symbol, in some embodiments, such action may be performed on a plurality of symbols. Additionally, while comparing a plurality of counts (e.g., counts corresponding to the first and second symbols) to select the largest count, the SMI logic 218 may determine the two largest counts are equal. Consequently, the SMI logic 218 may select one of the two symbols corresponding to such largest counts, respectively, and perform the evasive and/or corrective action on the selected symbol.

Further, the present methods and apparatus may detect memory access errors resulting from signal integrity problems (e.g., due to a bad connector or similar problem), timing misses (e.g., due to process shift), slow or fast drivers, etc. Additionally, the present methods and apparatus may detect memory access errors resulting from problems with a word line, sense amplifier, input/output driver or failure of an entire PMU (e.g., a chip kill).

Accordingly, while the present invention has been disclosed in connection with exemplary embodiments thereof, it should be understood that other embodiments may fall within the spirit and scope of the invention, as defined by the following claims.

The invention claimed is:

1. A method of reducing memory errors, comprising:
   detecting at least one error in data output from a first physical memory unit (PMU) of a memory;
   detecting at least one error in data output from a second PMU of the memory; and
   setting a bit indicating respective data output from a plurality of PMUs includes errors.

2. The method of claim 1 further comprising:
   defining a threshold; and
   determining respective error counts of the at least one error in data output from the first PMU and of the at least one error in data output from the second PMU do not exceed the threshold.

3. The method of claim 1 further comprising:
   logging the at least one error in data output from the first PMU of the memory; and
   logging the at least one error in data output from the second PMU of the memory.

4. The method of claim 3 wherein
   logging the at least one error in data output from the first PMU of the memory includes updating a first count indicating a number of previous memory accesses in which data output from the first PMU included an error; and
   logging the at least one error in data output from the second PMU of the memory includes updating a second count indicating a number of previous memory accesses in which data output from the second PMU included an error.

5. The method of claim 4 further comprising:
   if the first count is greater than the second count, selecting the first PMU;
   if the second count is greater than the first count, selecting the second PMU;
   correcting the error in data output from the selected PMU; and
   storing the corrected data in a third PMU of the memory.

6. The method of claim 5 further comprising directing a subsequent request to access the selected PMU to the third PMU.

7. The method of claim 1 further comprising:
   selecting one of the first and second PMUs;
   correcting the error in data output from the selected PMU; and
   storing the corrected data in a third PMU of the memory.

8. The method of claim 7 further comprising directing a subsequent request to access the selected PMU to the third PMU.

9. An apparatus for reducing memory errors, comprising:
   a memory including a plurality of physical memory units (PMUs); and
   logic, coupled to the memory, and adapted to:
      detect at least one error in data output from a first PMU of the memory;
      detect at least one error in data output from a second PMU of the memory; and
      set a bit indicating respective data output from a plurality of the PMUs includes errors.

10. The apparatus of claim 9 wherein the logic is further adapted to:
    define a threshold; and
    determine respective error counts of the at least one error in data output from the first PMU and of the at least one error in data output from the second PMU do not exceed the threshold.

11. The apparatus of claim 9 wherein the logic is further adapted to:
    log the at least one error in data output from the first PMU of the memory; and
    log the at least one error in data output from the second PMU of the memory.

12. The apparatus of claim 11 wherein the logic is further adapted to:
    update a first count indicating a number of previous memory accesses in which data output from the first PMU included an error; and
    update a second count indicating a number of previous memory accesses in which data output from the second PMU included an error.

13. The apparatus of claim 12 wherein the logic is further adapted to:
    if the first count is greater than the second count, select the first PMU;
    if the second count is greater than the first count, select the second PMU;
    correct the error in data output from the selected PMU; and
    store the corrected data in a third PMU of the memory.

14. The apparatus of claim 13 wherein the logic is further adapted to direct a subsequent request to access the selected PMU to the third PMU.

15. A system for reducing memory errors, comprising:
    a memory including a plurality of physical memory units (PMUs);
    logic coupled to the memory; and
    a processor, coupled to the memory and logic, and adapted to access the memory;
    the logic is adapted to:
       detect at least one error in data output from a first PMU of the memory;
       detect at least one error in data output from a second PMU of the memory; and
       set a bit indicating respective data output from a plurality of the PMUs includes errors.

16. The system of claim 15 wherein the logic is further adapted to:
  define a threshold; and
  determine respective error counts of the at least one error in data output from the first PMU and of the at least one error in data output from the second PMU do not exceed the threshold.

17. The system of claim 15 wherein the logic is further adapted to:
  log the at least one error in data output from the first PMU of the memory; and
  log the at least one error in data output from the second PMU of the memory.

18. The system of claim 17 wherein the logic is further adapted to:
  update a first count indicating a number of previous memory accesses in which data output from the first PMU included an error; and
  update a second count indicating a number of previous memory accesses in which data output from the second PMU included an error.

19. The system of claim 18 wherein the logic is further adapted to:
  if the first count is greater than the second count, select the first PMU;
  if the second count is greater than the first count, select the second PMU;
  correct the error in data output from the selected PMU; and
  store the corrected data in a third PMU of the memory.

20. The system of claim 19 wherein the logic is further adapted to direct a subsequent request to access the selected PMU to the third PMU.

* * * * *